United States Patent
Bartlow

[11] Patent Number: 5,825,088
[45] Date of Patent: Oct. 20, 1998

[54] LOW THERMAL RESISTANCE SEMICONDUCTOR PACKAGE AND MOUNTING STRUCTURE

[75] Inventor: Howard Dwight Bartlow, Sunnyvale, Calif.

[73] Assignee: Spectrian, Inc.

[21] Appl. No.: 37,508

[22] Filed: Mar. 24, 1993

Related U.S. Application Data

[63] Continuation of Ser. No. 694,424, May 1, 1991, abandoned.

[51] Int. Cl.[6] .................................................. H01L 23/34
[52] U.S. Cl. ......................... 257/712; 257/718; 257/719
[58] Field of Search .................................. 257/712, 718, 257/719; 357/79, 81, 82

[56] References Cited

U.S. PATENT DOCUMENTS

| | | |
|---|---|---|
| 3,636,415 | 1/1972 | Krver ......................................... 357/82 |
| 3,777,238 | 12/1973 | Rabvt ......................................... 357/82 |
| 4,141,028 | 2/1979 | Hvlstrunk ................................... 357/79 |
| 4,259,685 | 3/1981 | Romano ..................................... 357/81 |
| 4,649,460 | 3/1987 | Marchisi et al. .......................... 357/81 |
| 4,672,422 | 6/1987 | Schierz ...................................... 357/82 |
| 4,768,352 | 9/1988 | Maruyama ................................. 357/82 |
| 4,965,658 | 10/1990 | Norbeck et al. .......................... 357/79 |

*Primary Examiner*—Tom Thomas
*Assistant Examiner*—David Ostrowski
*Attorney, Agent, or Firm*—Townsend and Townsend and Crew, LLP; Henry K. Woodward

[57] ABSTRACT

A ceramic package and mounting structure which requires less surface area on a heat sink and improves heat transfer to the heat sink. Each ceramic package has a top side and a bottom side with the bottom side being flat and smooth. The bottom side can be a polished ceramic, or a metal layer which is plated or brazed to the bottom side. The mounting structure includes a clamp in pressure engagement with the top side of the package and maintains the package pressure engagement with the heat sink.

14 Claims, 2 Drawing Sheets

LOW THERMAL RESISTANCE SEMICONDUCTOR PACKAGE AND MOUNTING STRUCTURE

This is a Continuation of application Ser. No. 07/694,424, filed May 01, 1991, now abandoned.

BACKGROUND OF THE INVENTION

This invention relates generally to packaged semiconductor circuit devices, and more particularly the invention relates to a low thermal resistance semiconductor device package and mounting structure.

Semiconductor circuits and components for RF and microwave applications are typically mounted in ceramic packages which provide desired electrical isolation for the device. In power devices such as microwave amplifier transistors, the ceramic package must be mounted to a heat sink to remove heat from the device. Low thermal resistance is required between the package and heat sink to improve operation and prevent device failure.

Heretofore, the undersides of ceramic packages have included refractory metal layers such as molybdenum-manganese-gold and tungsten-gold with or without nickel layers. These metallizations are not flat and often build up in thickness around the ceramic edges and corners. However, these uneven metal layers are not a problem when the package is brazed to a mounting flange. The flange is then affixed to a heat sink. Use of the mounting flange significantly increases the "footprint" or surface area on the heat sink required for mounting the package, but elimination of the flange adversely affects heat transfer from the conventional package to the heat sink because of the uneven metal layers.

SUMMARY OF THE INVENTION

An object of the present invention is an improved semiconductor device package and mounting structure.

Another object of the invention is a semiconductor package having a smaller footprint while decreasing thermal resistance to a heat sink.

Yet another object of the invention is a semiconductor device package which is low in cost and reproducible.

Briefly, in accordance with the invention a ceramic package for a semiconductor device is provided with a smooth and flat bottom side which can abut directly with a heat sink without the need for a mounting flange. The bottom side surface can be the ceramic surface or a metal surface which is bonded or brazed to the bottom side ceramic surface or plated on a conventional refractory metal surface. The package is maintained in pressure engagement with the heat sink by a mounting fixture which engages the top surface of the package.

In one embodiment a metal bar or clamp provides pressure to the top of two spaced packages with a fastener extending through the clamp into the heat sink. Sufficient pressure is maintained on the packages to assure adequate heat transfer without physically damaging the package.

The invention and objects and features thereof will be more readily apparent from the following detailed description and appended claims when taken with the drawing.

DETAILED DESCRIPTION OF ILLUSTRATIVE EMBODIMENTS

Figure 1:
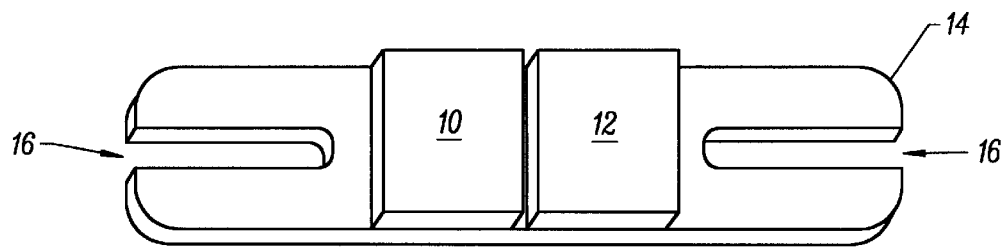
FIG. 1 is a perspective view of ceramic packages mounting with a flange in accordance with the prior art.

Referring now to the drawings, FIG. 1 is a perspective view of two ceramic packages 10, 12 mounted on a metal flange 14 in accordance with the prior art. The ceramic packages 10, 12 can have wrap around metallization or through hole metallization to the underside of the ceramic package for good low inductance grounding. Typically the metallization comprises multiple metal layers including a refractory metal, such as molybdenum-magnesium-gold and tungsten-gold with or without a nickel layer thereon. As noted above, such metal layers are not flat or smooth and often build up in thickness around the ceramic edges and corners. However, this is not a problem when the package is brazed to the flange 14.

Figure 2:
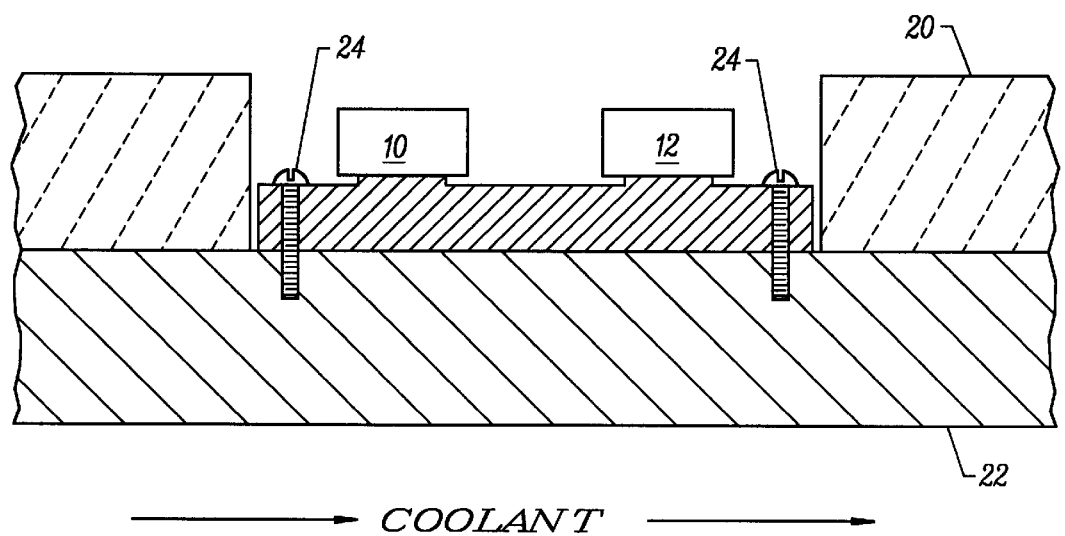
FIG. 2 is a section view illustrating the mounting of the package and flange of FIG. 1 on a heat sink.

FIG. 2 is a section view illustrating the mounting of the packages 10, 12 and flange 14 through a hole in a printed circuit board 20 and in contact with a surface with a heat sink 22. Typically, the heat sink 22 has a plurality of fins on the surface opposing the flange 14 which are cooled by the flow of a coolant. Screws 24 extend through slots 16 in either end of the flange 14 and fasten the flange and packages to the heat sink 22. As noted above, the use of the flange 14 increases the "footprint" or surface area on the heat sink and the size of the hole through the printed circuit board 20 which accommodates the flange. Further, medium-sized and larger packages can only be brazed over a small area (less than 0.300"in diameter) to minimize ceramic cracking. Typically, the flange will have small raised pedestals on which the packages are brazed. This small braze area raises thermal resistance significantly.

Figure 3:
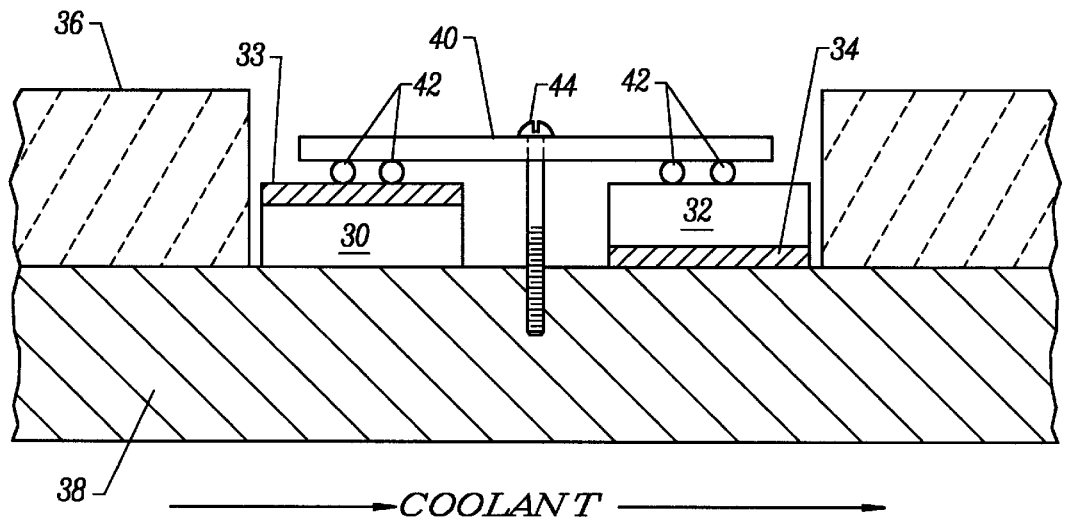
FIG. 3 is a section view of two ceramic packages and a mounting structure in accordance with one embodiment of the invention.

FIG. 3 is a section view of ceramic packages and mounting structure in accordance with one embodiment of the invention. For illustration purposes the ceramic package 30 has metallization 33 on the top side while the bottom side is a polished ceramic which abuts heat sink 38, while the package 32 has metallization 34 on the bottom side surface which engages directly with heat sink 38. Again, the packages are positioned through an opening in printed circuit board 36 to abut the heat sink. However, since a flange is not employed in mounting the packages to the heat sink, the opening through the printed circuit board 36 can be smaller in size than the opening through the printed circuit board in FIG. 2.

The mounting structure for the packages 30, 32 includes a metal clamp 40 and a fastener 44 which threadibly engages the heat sink 38. The clamp 40 exerts pressure on the packages 30, 32 to maintain good thermal transfer from the packages to the heat sink. In this embodiment a spacer 42 comprising a pliable ring of copper for example is positioned between the clamp 40 and the top sides of the two packages 30, 32. The mounting structure may also provide an electrical connection from the top side metallization 33 to the grounded heat sink.

To facilitate good heat transfer from the packages to the heat sink, the bottom side surfaces must be smooth. The package 30 has a ceramic bottom side surface which is polished to be very flat and smooth. Alternatively, the package 32 has metallization on the bottom side surface which can be readily polished for a smooth and flat surface. Thus a non flat and rough ceramic bottom side can be brazed or plated with a thermally conductive metal such as silver or copper to a thickness of several thousandths of an inch, and this layer is then smoothed and flattened. Advantageously, the smoothing step is repeatable if the surface is damaged or an upgrade of flatness or smoothness is desired. In another embodiment, the ceramic bottom side can be plated in the normal way using a refractory metal layer and then a suitable metal such as silver or copper is plated on the first metal layer. The plated layer can be smoothed and flattened until desired characteristics are obtained. Flattening and smoothing of the initial standard metallization is generally not possible without exposing ceramic at edges and corners which can degrade the package electric performances.

Figure 4:
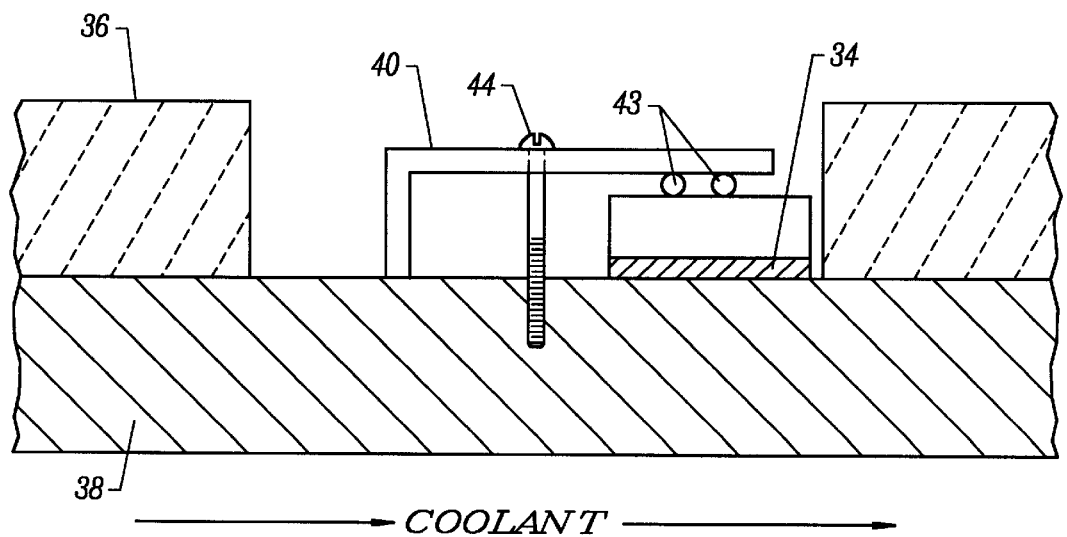
FIG. 4 is a section view illustrating a semiconductor package and mounting structure in accordance with another embodiment of the invention.

FIG. 4 is another embodiment of the mounting structure in accordance with the invention for affixing a single package to a heat sink. In this embodiment the clamp 40 engages the package 32 in a manner similar to that illustrated in FIG. 3, but the opposing end of clamp 40 is configured to engage the heat sink 38. Thus, the mounting of a single package is accommodated.

Infrared scans of essentially identical parts in standard packages and packages in accordance with the invention have demonstrated a 20–40% improvement in junction to heat sink thermal resistance. The mounting structure has proved to be reliable, low cost, and readily reproducible.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

I claim:

1. A low cost RF and microwave circuit and package combination having reduced thermal resistance and electrical inductance comprising a ceramic semiconductor device package and RF circuit housed therein, said package having a top side and a bottom side with a smooth and flat surface, a grounded heat sink having a top surface, said ceramic package being positioned in spaced alignment on said grounded heat sink with said bottom side directly abutting said top surface without intervening components thereby facilitating the reduced thermal resistance and electrical inductance, and means for maintaining said ceramic package in pressure engagement with said grounded heat sink including a clamp configured to exert pressure on said top side of said ceramic package, said clamp including offset portions whereby one portion engages said top surface of said heat sink and another portion exerts pressure on said top side of said ceramic package and a fastener extending through said clamp and engaging said grounded heat sink for low thermal impedance and efficient steady state removal of heat from said package and whereby said ceramic package is in electrical and thermal contact with said grounded heat sink.

2. The combination as defined by claim 1 and further including a spacer between said clamp and said top side.

3. The combination as defined by claim 1 wherein said ceramic package has a metal layer on its top side.

4. The combination as defined by claim 3 wherein said metal layer functions as a ground, said clamp and fastener electrically connecting said metal layer to said heat sink.

5. The combination as defined by claim 1 wherein said package has a metal layer on its bottom side which electrically and thermally engages said heat sink.

6. The combination as defined by claim 5 wherein said metal layer comprises a first metal layer including a metal brazed to said ceramic package and a second metal layer plated on said first metal layer.

7. A low cost RF and microwave circuit and package combination having reduced thermal resistance and electrical inductance comprising two ceramic semiconductor device packages and RF circuits housed therein, said packages having top sides and bottom sides with a smooth and flat surface, a grounded heat sink having a top surface, said ceramic packages being positioned in spaced alignment on said grounded heat sink with said bottom sides directly abutting said top surface without intervening components thereby facilitating the reduced thermal resistance and electrical inductance, and means for maintaining said ceramic packages in pressure engagement with said grounded heat sink including a clamp configured to exert pressure on said top sides of said ceramic packages and a fastener extending through said clamp between said packages and engaging said grounded heat sink for low thermal impedance and efficient steady state removal of heat from said package and whereby said ceramic packages are in electrical and thermal contact with said grounded heat sink.

8. The combination as defined by claim 7 wherein said bottom side of said ceramic package comprises a smooth ceramic surface.

9. The combination as defined by claim 8 wherein said top side includes a metal layer which functions as a ground.

10. The combination as defined by claim 7 where in said bottom side of said ceramic package comprises a thermally conductive metal bonded or brazed to said ceramic package.

11. The combination as defined by claim 10 wherein said thermally conductive layer functions as a ground.

12. The combination as defined by claim 11 wherein said thermally conductive metal comprises a first metal layer including a metal brazed to said ceramic package and a second metal layer plated on said first metal layer.

13. The combination as defined by claim 7 and further including pliable spacer means between said clamp and said top side.

14. The combination as defined by claim 13 wherein said pliable spacer means comprises a copper ring.

* * * * *